United States Patent [19]
Komoike

[11] Patent Number: 6,137,330
[45] Date of Patent: Oct. 24, 2000

[54] INTEGRATED CIRCUIT INCLUDING FUNCTIONAL BLOCKS CONTROLLED BY COMMON SYNCHRONIZING CONTROL TRANSISTORS

[75] Inventor: Tatsunori Komoike, Tokyo, Japan

[73] Assignee: Mitsubishi Denki Kabushiki Kaisha, Tokyo, Japan

[21] Appl. No.: 09/080,258

[22] Filed: May 18, 1998

[30] Foreign Application Priority Data

Dec. 24, 1997 [JP] Japan ................................. 9-355648

[51] Int. Cl.[7] .......................................................... H03K 3/12
[52] U.S. Cl. ............................................ 327/199; 327/403
[58] Field of Search ..................................... 327/199, 202, 327/203, 208, 210, 211, 212, 403, 404, 405

[56] References Cited

U.S. PATENT DOCUMENTS

| | | |
|---|---|---|
| 5,029,279 | 7/1991 | Sasaki et al. . |
| 5,103,116 | 4/1992 | Sivilotti et al. ...................... 307/272.2 |
| 5,408,138 | 4/1995 | Khosravi et al. ....................... 327/203 |
| 5,455,528 | 10/1995 | Partovi et al. ............................. 326/98 |
| 5,481,209 | 1/1996 | Lim et al. . |
| 5,825,224 | 10/1998 | Klass et al. ............................. 327/200 |
| 5,889,422 | 3/1999 | Kmoike et al. .......................... 327/200 |
| 5,945,858 | 8/1999 | Sato ....................................... 327/202 |
| 5,955,912 | 9/1999 | Ko .......................................... 327/410 |

*Primary Examiner*—Jeffrey Zweizig
*Attorney, Agent, or Firm*—Burns, Doane, Swecker & Mathis, LLP

[57] ABSTRACT

An integrated circuit including a plurality of functional blocks sharing synchronizing control transistors for carrying out synchronizing control of the plurality of functional blocks in common in response to a clock signal supplied to their control terminals. This makes it possible to reduce the number of the synchronizing control transistors as compared with a conventional circuit in which each of the functional blocks includes synchronizing control transistors independently.

15 Claims, 7 Drawing Sheets

INTEGRATED CIRCUIT INCLUDING FUNCTIONAL BLOCKS CONTROLLED BY COMMON SYNCHRONIZING CONTROL TRANSISTORS

BACKGROUND OF THE INVENTION

1. Field of the Invention

The present invention relates to an integrated circuit for implementing a desired electronic circuit through a CMOS process or the like, and particularly to an integrated circuit based on a macrocell scheme that forms an intended electronic circuit by combining a plurality of functional blocks with predetermined functions.

2. Description of Related Art

Conventionally, circuit designers have designed such a type of integrated circuits by considering transistor characteristics and the like to meet the intended functions of the electronic circuits. However, it takes unendurably long time for the designers to carry out the design of the recent high density integrated circuits by considering such details as the transistor characteristics. Thus, in common integrated circuits, basic functional blocks such as flip-flops, latches and the like are designed by functional block designers with considering the transistor characteristics so that the circuit designers can build the intended electronic circuits by only combining these functional blocks under certain conditions.

Figure 7A:
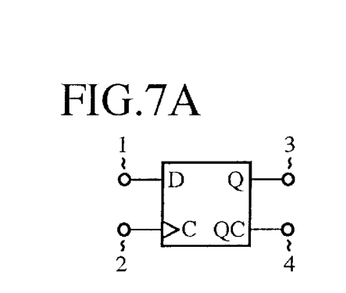
FIG. 7A shows a standard graphical symbol of the D flip-flop at a functional block design level.
Figure 7B:
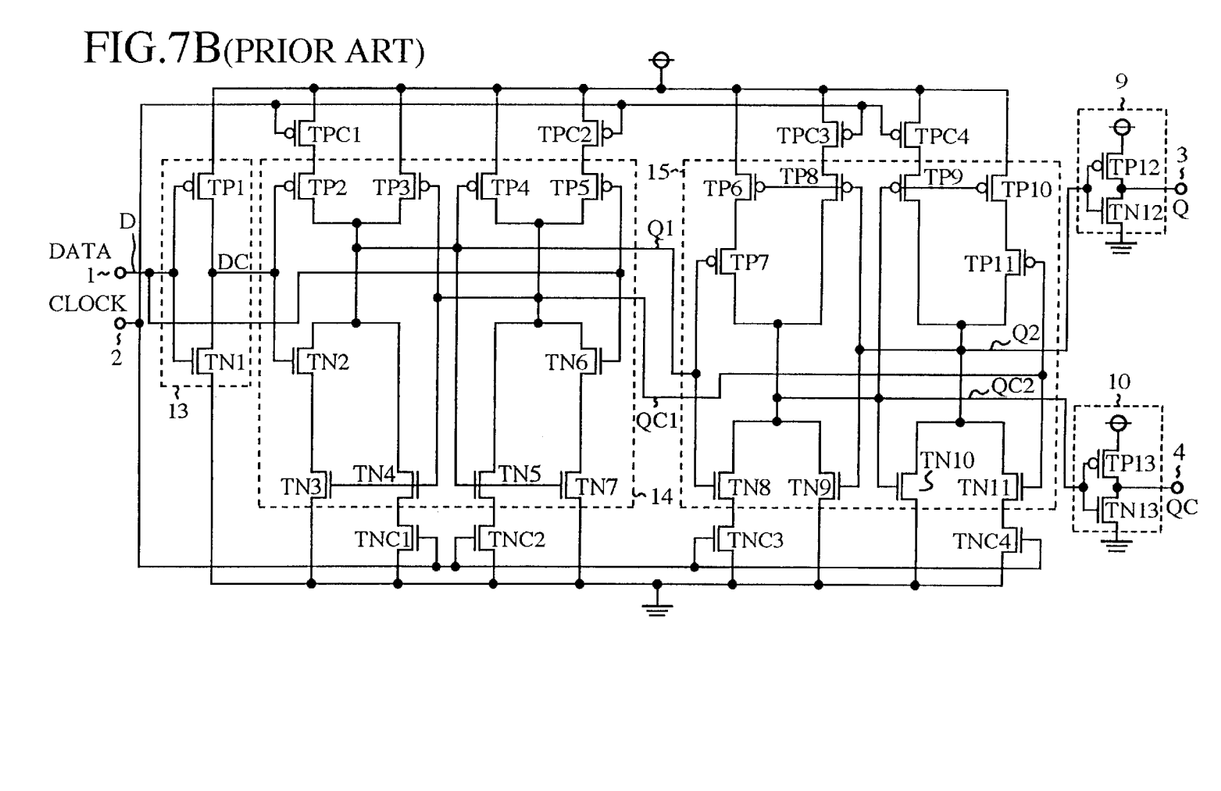
FIG. 7B is a circuit diagram showing its internal configuration.

FIG. 7A shows a standard graphic symbol for a D flip-flop at a conventional functional block design level, and FIG. 7B shows its internal configuration. In these figures, the reference numeral 1 designates a data input terminal, 2 designates a clock input terminal, 3 designates a Q output terminal, and 4 designates a QC output terminal, where C denotes an inverted one.

In FIG. 7B, the reference numeral 13 designates a data inverter that inverts input data D applied to the data input terminal 1 and outputs it as inverted data DC; 14 designates a pre-stage latch circuit that latches the input data D and inverted data DC in response to the clock input to the clock input terminal 2, and outputs pre-stage latch data Q1 and inverted pre-stage latch data QC1; 15 designates a pre-stage latch circuit that latches the pre-stage latch data Q1 and inverted pre-stage latch data QC1 in response to the clock input to the clock input terminal 2, and outputs post-stage latch data Q2 and inverted post-stage latch data QC2; 9 designates a Q output buffer that inverts and amplifies the post-stage latch data Q2 to be output through the Q output terminal 3; and 10 designates a QC output buffer that inverts and amplifies the inverted post-stage latch data QC2 to be output through the QC output terminal 4.

Reference symbols TP1–TP13 and TPC1–TPC4 each designate a P-channel transistor formed on a CMOS semiconductor substrate, and symbols TN1–TN13 and TNC1–TNC4 each designate an N-channel transistor formed on the semiconductor substrate.

As is well-known, the D flip-flop latches the input data D at the rising edge of the clock C, and outputs it. The details of the operation will be omitted here because they will be described later.

With such an arrangement, the conventional integrated circuit must use a lot of transistors for each functional block, which hinders higher integration and lower power consumption.

More specifically, transistors disposed on the semiconductor substrate of the integrated circuit formed by the conventional macrocell scheme are formed in such a manner that each of them occupies a fixed area because it is not known which areas are assigned to which functional blocks. In addition, the transistors are each formed in a considerably large size to meet their maximum ratings. As a result, the functional blocks occupy unduly large areas on the substrate. It is not necessary for the functional blocks, however, to operate at such a large current, which holds true with the transistors of the flip-flops.

In addition, the functional blocks like the flip-flops that undergo synchronization by a clock signal constitute a very large part of the actually used functional blocks, and hence areas needed for clock wiring constitute one of the factors that hinder the high density integration.

Thus, the high density integration is hampered by the unduly large functional blocks or the redundant configuration of the clock system. As a result, it is not unlikely that the clock wiring cannot be formed between the functional blocks, which presents a problem of hindering a highly integrated electronic circuit.

SUMMARY OF THE INVENTION

The present invention is implemented to solve the foregoing problem. It is therefore an object of the present invention to provide a high density, low power consumption integrated circuit with a simplified clock system and reduced occupying areas for the functional blocks.

According to a first aspect of the present invention, there is provided an integrated circuit including a plurality of functional blocks undergoing synchronizing control by a clock signal, the integrated circuit comprising: at least two synchronizing control transistors for carrying out synchronizing control of the plurality of functional blocks in common in response to the clock signal supplied to their control terminals.

According to a second aspect of the present invention, there is provided an integrated circuit based on a macrocell scheme that forms a desired electronic circuit by combining a plurality of functional blocks, the integrated circuit comprising: at least two synchronizing control transistors for carrying out in common synchronizing control of the plurality of functional blocks which undergo the synchronizing control in response to a clock signal supplied to a control terminal of the synchronizing control transistors.

Here, the plurality of functional blocks may each have multiple stages, and wherein each of the synchronizing control transistors may carry out in common the synchronizing control of at least one of the multiple stages of the plurality of functional blocks.

The synchronizing control transistors may consist of one P-channel transistor and one N-channel transistor, each of which is provided in common to all the stages of the plurality of functional blocks.

BRIEF DESCRIPTION OF THE DRAWINGS

FIGS. 7A and 7B are diagrams showing a conventional D flip-flop, wherein

DETAILED DESCRIPTION OF THE PREFERRED EMBODIMENTS

The invention will now be described with reference to the accompanying drawings.

Embodiment 1

Figure 1:
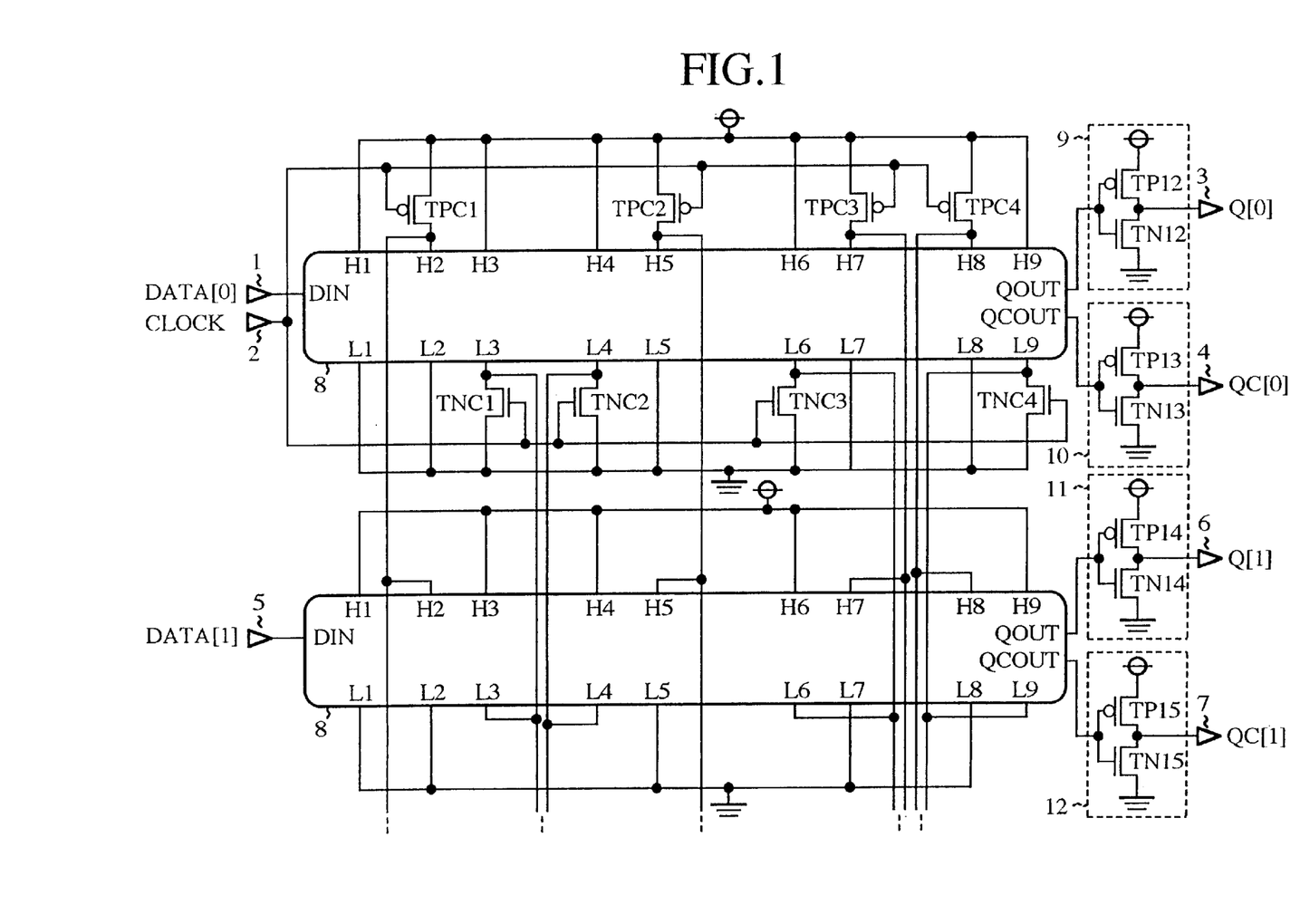
FIG. 1 is a macrocell layout diagram showing connections around two flip-flops which are employed as functional blocks of an embodiment 1 of an integrated circuit in accordance with the present invention.

FIG. 1 is a macrocell layout diagram showing connections around two flip-flops which are employed as functional blocks of an embodiment 1 of an integrated circuit in accordance with the present invention. In FIG. 1, reference numerals 1 and 5 each designate a data input terminal; 2 designates a clock input terminal; 3 and 6 each designate a Q output terminal; 4 and 7 each designate a QC output terminal, where C represents an inverted one; 8s each designate a flip-flop (functional block) that latches the input data D applied to each data input node DIN, and outputs the latched data from QOUT node and QCOUT node; 9 and 11 each a Q output buffer that inverts and amplifies the output from the QOUT node of the each flip-flop 8, and outputs it through the Q output terminal; and 10 and 12 each designate a QC output buffer that inverts and amplifies the output from the QCOUT node of the each flip-flop 8, and outputs it through the QC output terminal.

Symbols TPC1–TPC4 each designate a P-channel transistor (synchronizing control transistor) that is formed on a semiconductor substrate, and has its source connected to a higher potential power supply, and has its gate supplied with clock C fed from the clock input terminal 2; and symbols TNC1–TNC4 each designate an N-channel transistor (synchronizing control transistor) that is formed on the semiconductor substrate, and has its source connected to a lower potential power supply, and has its gate supplied with the clock C fed from the clock input terminal 2. Symbols TP12–TP15 each designate a P-channel transistor that is formed on the semiconductor substrate, and has its source connected to the higher potential power supply, and has its gate supplied with the QOUT node output or QCOUT node output; symbols TN12–TN15 each designate an N-channel transistor that is formed on the semiconductor substrate, and has its source connected to the lower potential power supply, and has its gate supplied with the QOUT node output or QCOUT node output.

Figure 2:
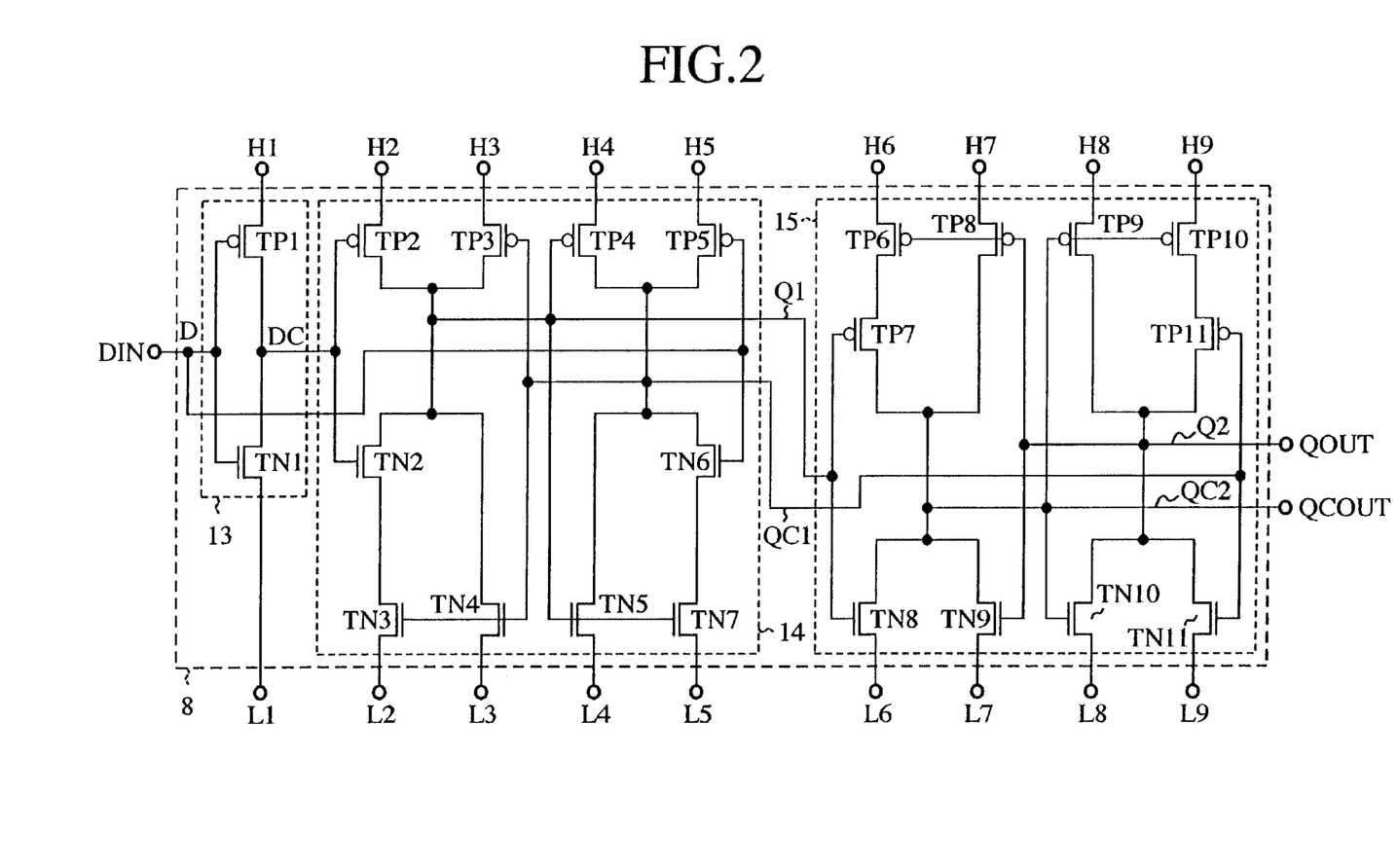
FIG. 2 is a transistor level circuit diagram showing an internal configuration of the flip-flop in the embodiment 1.

FIG. 2 is a transistor level circuit diagram showing an internal configuration of the flip-flop 8 of the embodiment 1 of the integrated circuit in accordance with the present invention. In FIG. 2, the reference numeral 13 designates a data inverter that inverts the input data D supplied to the DIN node, and outputs inverted data DC; 14 designates a pre-stage latch circuit that latches the input data D and inverted data DC in response to the clock C fed through the clock input terminal 2, and outputs pre-stage latch data Q1 and inverted pre-stage latch data QC1; and 15 designates a post-stage latch circuit that latches the pre-stage latch data Q1 and inverted pre-stage latch data QC1 in response to the clock C fed through the clock input terminal 2, and outputs post-stage latch data Q2 and inverted post-stage latch data QC2. The post-stage latch data Q2 is output through the QOUT node, and the inverted post-stage latch data QC2 is output through the QCOUT node.

The flip-flops 8 each have their H1, H3, H4, H6 and H9 nodes directly connected to the higher potential power supply, have their H2 nodes commonly connected to the higher potential power supply through the TPC1 transistor, have their H5 nodes commonly connected to the higher potential power supply through the TPC2 transistor, have their H7 nodes commonly connected to the higher potential power supply through the TPC3 transistor, and have their H8 nodes commonly connected to the higher potential power supply through the TPC4 transistor. In addition, the flip-flops 8 each have their L1, L2, L5, L7 and L8 nodes directly connected to the lower potential power supply, have their L3 nodes commonly connected to the lower potential power supply through the TNC1 transistor, have their L4 nodes commonly connected to the lower potential power supply through the TNC2 transistor, have their L6 nodes commonly connected to the lower potential power supply through the TNC3 transistor, and have their L9 nodes commonly connected to the lower potential power supply through the TNC4 transistor.

Next, the operation of the embodiment 1 will be described.

As is well known, the D flip-flop latches and outputs the input data D at the rising edge (positive transition) of the clock C, but is locked out and is unresponsive to further changes in the input data D until the clock returns to the low level and another positive transition occurs. Thus, we will describe its operation in terms of the following cases: (1) while the clock is at the low level; (2) when it changes from the low to high level; (3) while it is at the high level; and (4) when it changes from the high to low level.

First, when the input data D is applied to the data input terminals 1 and 5, each of the data inverters 13 inverts the input data D and outputs the inverted data DC.

(1) While the clock C is at the low level.

While the clock input terminal 2 is placed at the low level, TNC1–TNC4 are in the OFF state, and TPC1–TPC4 are in the ON state. Thus, the levels of the pre-stage latch data Q1 and inverted pre-stage latch data QC1 change in response to the inputs to the gates of the TP2 and TP5. Specifically, high level input data D brings the TP2 into conduction, which places the pre-stage latch data Q1 at the high level and the inverted pre-stage latch data QC1 at the low level, while low level input data D brings the TP5 into conduction, which places the pre-stage latch data Q1 at the low level and the inverted pre-stage latch data QC1 at the high level.

Assuming here that the post-stage latch data Q2 is at the high level and the inverted post-stage latch data QC2 is at the low level, the post-stage latch data Q2 is maintained at the high level through TPC4 and TP9 which are placed in the ON state. Accordingly, any change in the pre-stage latch data Q1 does not affect the output of the D flip-flop circuit in this case.

On the other hand, assuming that the post-stage latch data Q2 is at the low level and the inverted post-stage latch data QC2 is at the high level, the inverted post-stage latch data QC2 is maintained at the high level through TPC3 and TP8 which are placed in the ON state. Accordingly, any change in the pre-stage latch data Q1 does not affect the output of the D flip-flop circuit in this case.

In summary, while the clock C is maintained at the low level, although the operation state of the pre-stage latch circuit 14 and that of the input portion of the post-stage latch circuit 15 change in response to the input data D, the post-stage latch circuit 15 keeps its output state independently of these changes. In other words, the Q output and QC output of the D flip-flop are unchanged.

(2) When the clock C makes the positive transition from the low to high level.

In this case, the D flip-flop latches and outputs the input data D at the positive edge of the clock C.

As described above, while the clock C is at the low level and the input data D is at the high level, the pre-stage latch data Q1 is at the high level and the inverted pre-stage latch data QC1 is at the low level, and this state is maintained through TP3, and TN6 and TN7. A positive transition of the clock C in this state brings TNC1–TNC4 into conduction, and TPC1–TPC4 out of conduction, which in turn brings TN8 and TNC3 into the ON state, thereby placing the inverted post-stage latch data QC2 at the low level. This also causes TP10 and TP11 to conduct, placing the post-stage latch data Q2 at the high level which is maintained through TN9 that keeps the inverted post-stage latch data QC2 at the low level.

On the other hand, while the clock C is at the low level and the input data D is also at the low level, the pre-stage latch data Q1 is at the low level and the inverted pre-stage latch data QC1 is at the high level, and this state is maintained through TP4, and TN2 and TN3. A positive transition of the clock C in this state brings TNC1–TNC4 into conduction and TPC1–TPC4 out of conduction, which in turn brings TN11 and TNC4 into the ON state, thereby placing the post-stage latch data Q2 at the low level. This causes TP6 and TP7 to conduct, placing the inverted post-stage latch data QC2 at the high level which is maintained through TN10 that keeps the post-stage latch data Q2 at the low level.

In this way, the input data D is latched by the D flip-flop circuit and is output at the positive transition of the clock C.

(3) While the clock C is at the high level.

In this case, any changes in the input data D does not affect the output state of the D flip-flop circuit.

As described above, the positive transition of the clock C while the input data D is at the high level places the pre-stage latch data Q1 at the high level, and the inverted pre-stage latch data QC1 at the low level. This state is maintained through TP3, and TN5 and TNC2 independently of any further change in the input data D while the clock C is at the high level.

On the other hand, the positive transition of the clock C while the input data D is at the low level places the pre-stage latch data Q1 at the low level, and the inverted pre-stage latch data QC1 at the high level. This state is maintained through TP4, and TN4 and TNC1 independently of any further change in the input data D while the clock C is at the high level. Thus, the positive transition of the clock C fixes the pre-stage latch data Q1 at the high level and inverted pre-stage latch data QC1 at the low level when the input data D is at the high level, while it fixes them at the opposite state when the input data D is at the low level.

In the post-stage latch circuit 15, on the other hand, the high level pre-stage latch data Q1 causes TN8 to conduct, which places the inverted post-stage latch data QC2 at the low level and the post-stage latch data Q2 at the high level. In contrast, the high level inverted pre-stage latch data QC1 causes TN11 to conduct, which places the post-stage latch data Q2 at the low level and the inverted post-stage latch data QC2 at the high level. However, since the pre-stage latch data Q1 and inverted pre-stage latch data QC1 are maintained at the fixed states independently of any change in the input data D while the clock C is kept at the high level as described above, the post-stage latch data Q2 and inverted post-stage latch data QC2 are maintained at the fixed levels.

In summary, although the input portion of the pre-stage latch circuit 14 changes its state in response to the input data D, its output portion and the post-stage latch circuit 15 maintain their states. Thus, while the clock C is at the high level, the Q output and QC output of the D flip-flop do not change.

(4) When the clock C makes a negative change from the high level to the low level.

When the negative transition of the clock C from the high level to the low level occurs, the output of the D flip-flop does not change whether the input data D is either at the high level or at the low level.

Specifically, the output state of the pre-stage latch circuit 14 while the clock C is at the high level is maintained through TP3 or TP4 even if the clock C makes a negative transition from the high level to the low level. Thus, the output state of the D flip-flop circuit does not change in this case.

According to the present embodiment 1, since each of the synchronizing control transistors, which is provided in common for each one of the stages of the flip-flop circuits, supplies the clock C to the plurality of the flip-flops in common from the clock input terminal 2, the number of the transistors can be reduced as compared with a conventional circuit which uses the dedicated clock transistors for each stage of each flip-flop. In addition, since the total length of wiring in the clock distribution system is substantially reduced owing to the reduction in the number of the transistor, the wiring capacitance thereof is also substantially reduced.

Thus, the present embodiment 1 makes it possible to use the transistors, which have a sufficient margin of driving capability in the clock system, in common to the plurality of the functional blocks in the macrocell scheme that forms a desired electronic circuit by combining a plurality of functional blocks. Accordingly, the number of transistors required for implementing an electronic circuit of the same function can be reduced, which results in the reduction in the area occupied by the functional blocks. Furthermore, since the wiring capacitance of the clock distribution system is reduced by the common use of the transistors, the current consumption of the clock system for operating the electronic circuit of the same function can also be reduced.

In this case, since the common use of the clock transistors is carried out on a functional block basis of the macrocell scheme, circuit designers can utilize the gate-array type semiconductor substrate by only performing the circuit design without sacrificing any convenience in designing the circuit.

Embodiment 2

Figure 3:
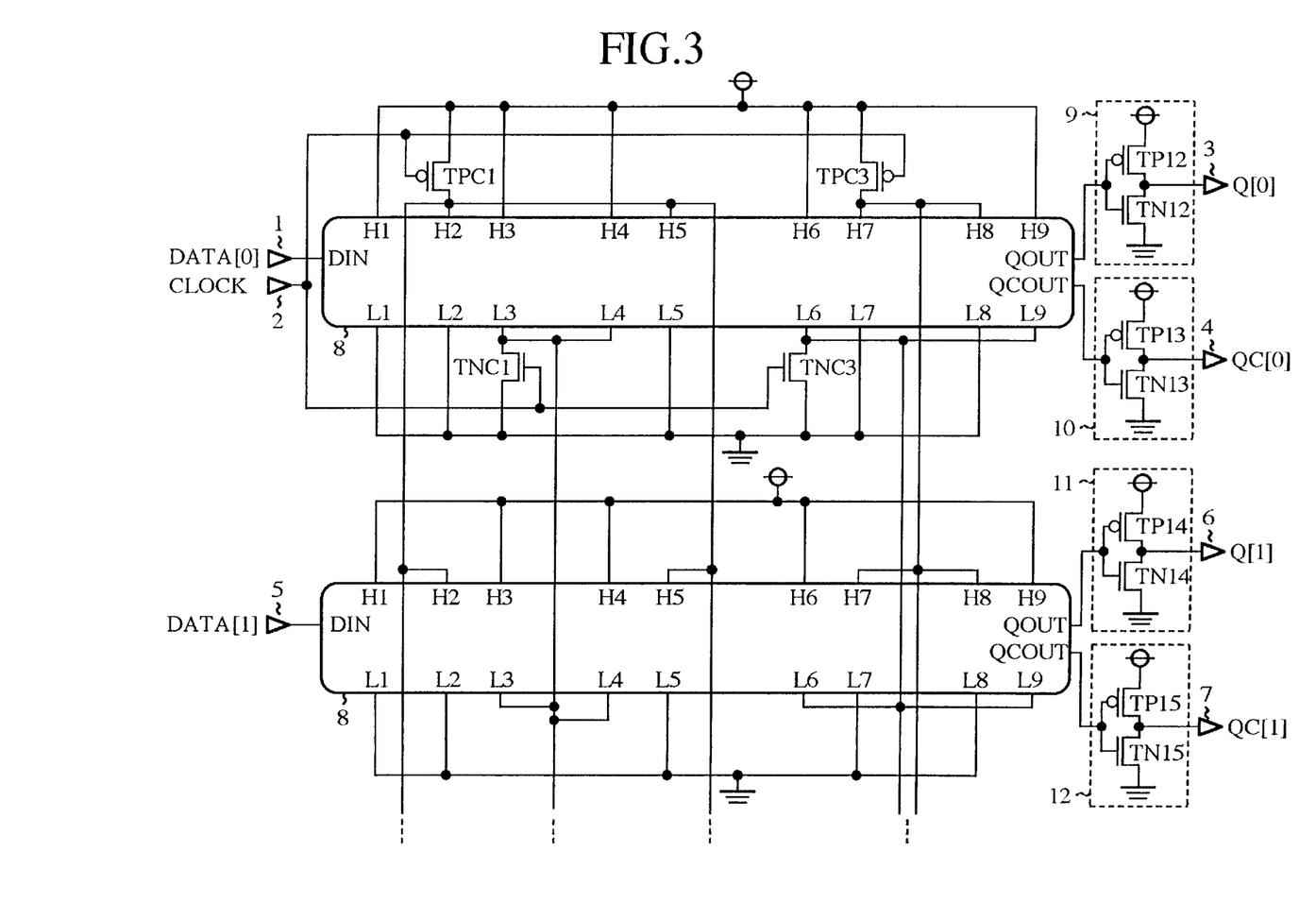
FIG. 3 is a macrocell layout diagram showing connections around two flip-flops which are employed as functional blocks of an embodiment 2 of the integrated circuit in accordance with the present invention.

FIG. 3 is a macrocell layout diagram showing connections around two flip-flops which are employed as functional blocks of an embodiment 2 of the integrated circuit in accordance with the present invention. In FIG. 3, the respective flip-flops have their H2 and H5 nodes connected in common to the higher potential power supply through the TPC1 transistor; have their H7 and H8 nodes connected in common to the higher potential power supply through the TPC3 transistor; have their L3 and L4 nodes connected in common to the lower potential power supply through the TNC1 transistor; and have their L6 and L9 nodes connected in common to the lower potential power supply through the TNC3 transistor.

Since the remaining configuration including the internal arrangement of the flip-flops themselves is the same as that of the embodiment 1, the description thereof is omitted here by designating like portions by the same reference symbols.

Next, the operation of the present embodiment 2 will be described. The D flip-flop of the embodiment 2 is the same as that of the embodiment 1 in that it latches the input data D at the positive transition of the clock C, and outputs it.

More specifically, while the clock C applied to the clock input terminal 2 is at the low level, TP2, TP5, TP8 and TP9 in FIG. 2 are brought into conduction or out of conduction in response to their gate inputs, whereas TN4, TN5, TN8 and TN11 each maintain their OFF state. Thus, although the pre-stage latch circuit 14 and the input stage portion of the post-stage latch circuit 15 changes their states in response to the inputs, the output of the post-stage latch circuit 15 does not change as in the embodiment 1.

On the other hand, while the clock C applied to the clock input terminal 2 is at the high level, TP2, TP5, TP8 and TP9 each maintain their OFF state, whereas TN4, TN5, TN8 and TN11 are brought into conduction or out of conduction in response to their gate inputs. Thus, although the input portion of the pre-stage latch circuit 14 and the post-stage latch circuit 15 each change their states in response to their inputs, since the output of the pre-stage latch circuit 14 does not change, the post-stage latch circuit 15 maintains its output state as in the embodiment 1. In this case, when the clock makes a positive transition from the low level to the high level, it latches the input data D at the positive transition, and maintains the latched data as the Q output and QC output.

Thus, the embodiment 2 can achieve, besides the effect and advantages of the embodiment 1, further reduction in the circuit scale and power consumption because it halves the number of transistors used in the clock system associated with the flip-flops from that required in the embodiment 1.

In addition, since the number of transistors in the clock system is reduced by their common use in each of the functional blocks, further reduction in the circuit scale and power consumption can be achieved.

Embodiment 3

Figure 4:
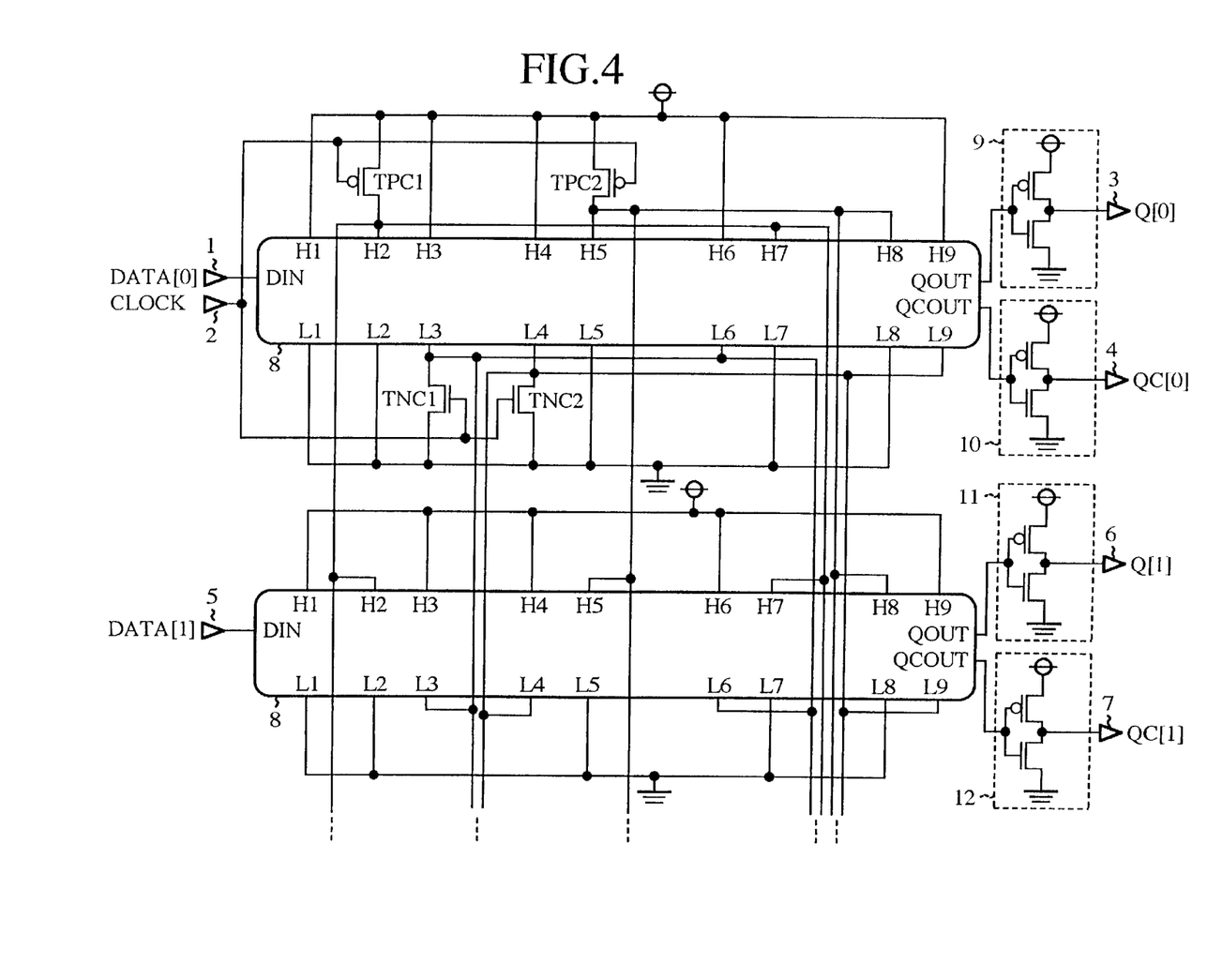
FIG. 4 is a macrocell layout diagram showing connections around two flip-flops which are employed as functional blocks of an embodiment 3 of the integrated circuit in accordance with the present invention.

FIG. 4 is a macrocell layout diagram showing connections around two flip-flops which are employed as functional blocks of an embodiment 3 of the integrated circuit in accordance with the present invention. In FIG. 4, the respective flip-flops have their H2 and H7 nodes connected in common to the higher potential power supply through the TPC1 transistor; have their H5 and H8 nodes connected in common to the higher potential power supply through the TPC2 transistor; have their L3 and L6 nodes connected in common to the lower potential power supply through the TNC1 transistor; and have their L4 and L9 nodes connected in common to the lower potential power supply through the TNC2 transistor.

Since the remaining configuration including the internal arrangement of the flip-flops themselves is the same as that of the embodiment 1, the description thereof is omitted here by designating like portions by the same reference symbols.

The embodiment 3 operates in the same fashion as the foregoing embodiments 1 and 2.

Thus, the embodiment 3 can achieve, besides the effect and advantages of the embodiment 1, further reduction in the circuit scale and power consumption because it halves the number of transistors used in the clock system associated with the flip-flops from that required in the embodiment 1.

In addition, since the number of transistors in the clock system is reduced by their common use in each of the functional blocks, further reduction in the circuit scale and power consumption can be achieved.

Embodiment 4

Figure 5:
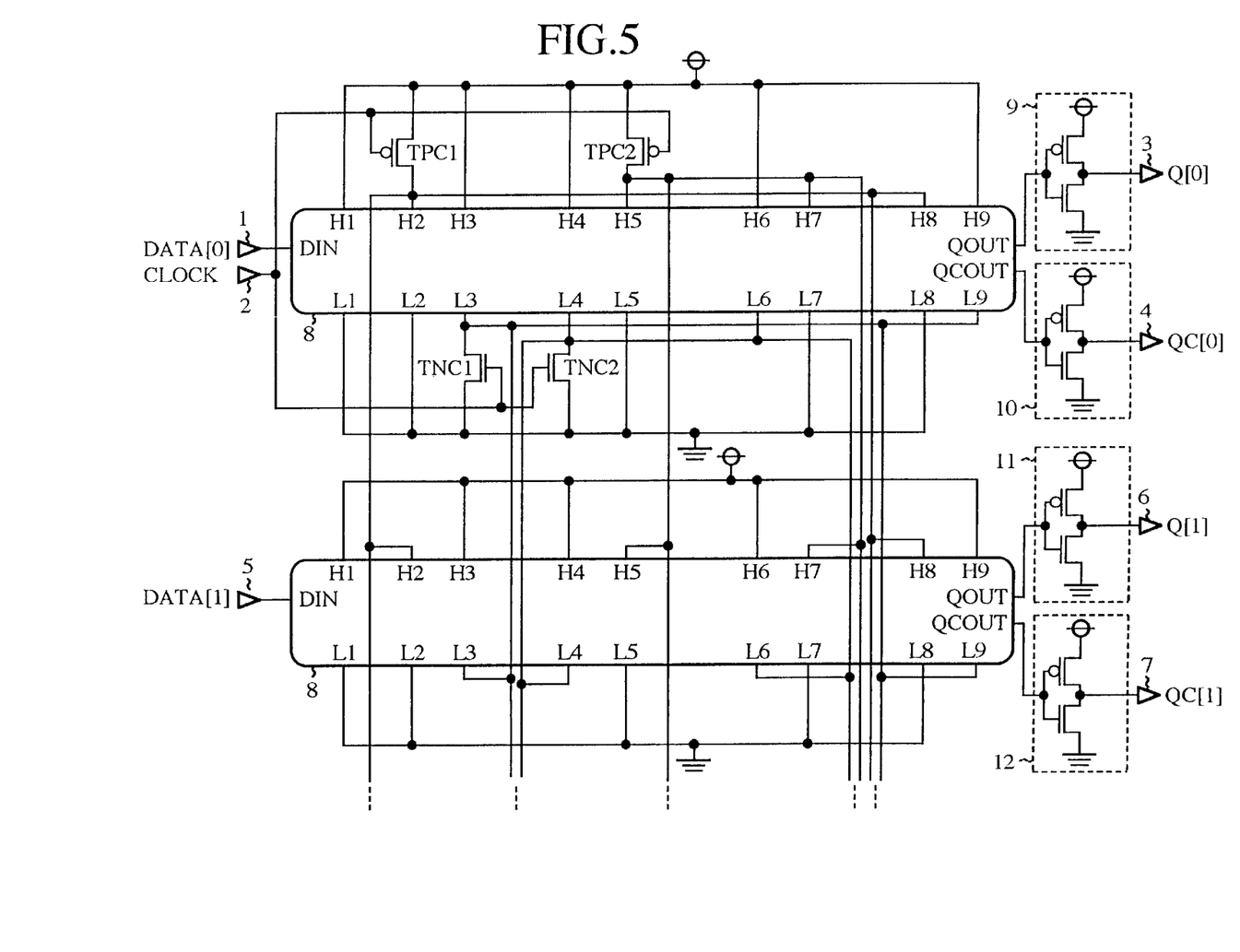
FIG. 5 is a macrocell layout diagram showing connections around two flip-flops which are employed as functional blocks of an embodiment 4 of the integrated circuit in accordance with the present invention.

FIG. 5 is a macrocell layout diagram showing connections around two flip-flops which are employed as functional blocks of an embodiment 4 of the integrated circuit in accordance with the present invention. In FIG. 5, the respective flip-flops have their H2 and H8 nodes connected in common to the higher potential power supply through the TPC1 transistor; have their H5 and H7 nodes connected in common to the higher potential power supply through the TPC2 transistor; have their L3 and L9 nodes connected in common to the lower potential power supply through the TNC1 transistor; and have their L4 and L6 nodes connected in common to the lower potential power supply through the TNC2 transistor.

Since the remaining configuration including the internal arrangement of the flip-flops themselves is the same as that of the embodiment 1, the description thereof is omitted here by designating like portions by the same reference symbols.

The embodiment 4 operates in the same fashion as the foregoing embodiments.

Thus, the embodiment 4 can achieve, besides the effect and advantages of the embodiment 1, further reduction in the circuit scale and power consumption because it halves the number of transistors used in the clock system associated with the flip-flops from that required in the embodiment 1.

In addition, since the number of transistors in the clock system is reduced by their common use in each of the functional blocks, further reduction in the circuit scale and power consumption can be achieved.

Embodiment 5

Figure 6:
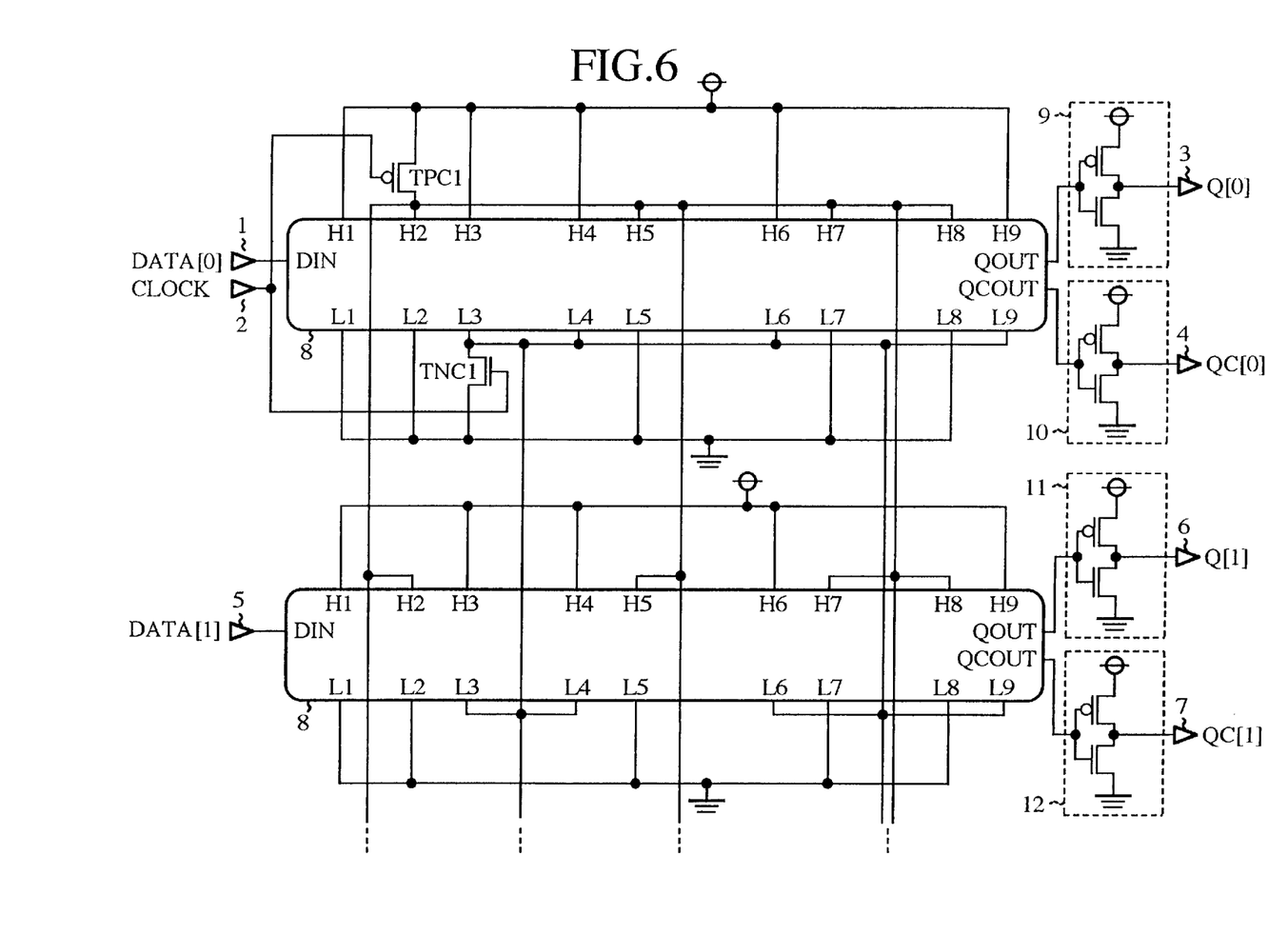
FIG. 6 is a macrocell layout diagram showing connections around two flip-flops which are employed as functional blocks of an embodiment 5 of the integrated circuit in accordance with the present invention.

FIG. 6 is a macrocell layout diagram showing connections around two flip-flops which are employed as functional blocks of an embodiment 5 of the integrated circuit in accordance with the present invention. In FIG. 6, the respective flip-flops have their H2, H5, H7 and H8 nodes connected in common to the higher potential power supply through the TPC1 transistor; and have their L3, L4, L6 and L9 nodes connected in common to the lower potential power supply through the TNC1 transistor.

Since the remaining configuration including the internal arrangement of the flip-flops themselves is the same as that of the embodiment 1, the description thereof is omitted here by designating like portions by the same reference symbols.

The embodiment 5 operates in the same fashion as the foregoing embodiments.

Thus, the embodiment 5 can achieve, besides the effect and advantages of the embodiment 1, further reduction in the circuit scale and power consumption because it comprises only one P-channel transistor TPC1 and only one N-channel transistor TNC1 in common to the plurality of the functional blocks.

Although the present invention is applied to the couple of flip-flop circuits in the foregoing embodiments, it is obvious that the present invention can be applied to other functional blocks.

What is claimed is:

1. An integrated circuit including a plurality of flip-flops connected in parallel, undergoing synchronizing control by a clock signal, said integrated circuit comprising:

at least two synchronizing control transistors for carrying out synchronizing control of said plurality of flip-flops in common in response to said clock signal supplied to their control terminals.

2. The integrated circuit as claimed in claim 1, wherein said plurality of flip-flops each have multiple states, and wherein each of said synchronizing control transistors carries out in common the synchronizing control of at least one of said multiple stages of said plurality of flip-flops.

3. The integrated circuit as claimed in claim 2, wherein said synchronizing control transistors consist of one P-channel transistor and one N-channel transistor, each of which is provided in common to all the stages of said plurality of flip-flops.

4. An integrated circuit based on a macrocell scheme that forms a desired electronic circuit by combining a plurality of flip-flops which are connected in parallel, said integrated circuit comprising:

at least two synchronizing control transistors for carrying out in common synchronizing control of said plurality of flip-flops which undergo the synchronizing control in response to a clock signal suppled to a control terminal of said synchronizing control transistors.

5. The integrated circuit as claimed in claim 4, wherein said plurality of flip-flops each have multiple stages, and wherein each of said synchronizing control transistors caries out in common the synchronizing control of at least one of said multiple stages of said plurality of flip-flops.

6. The integrated circuit as claimed in claim 5, wherein said synchronizing control transistors consist of one P-channel transistor and one N-channel transistor, each of which is provided in common to all the stages of said plurality of flip-flops.

7. The integrated circuit as claimed in claim 1, wherein the flip-flops are identically configured.

8. The integrated circuit as claimed in claim 4, wherein the flip-flops are identically configured.

9. The integrated circuit as claimed in claim 1, wherein the flip-flops include respective input nodes which are independent from each other, and respective output nodes which are independent from each other.

10. The integrated circuit as claimed in claim 4, wherein the flip-flops include respective input nodes which are independent from each other, and respective output nodes which are independent from each other.

11. The integrated circuit as claimed in claim 1, wherein each flip-flop includes at least one node connected to a high potential power supply via one of said at least two synchronizing control transistors, and wherein each flip-flop includes at least one other node connected to a low potential power supply via another of said at least two synchronizing control transistors.

12. The integrated circuit as claimed in claim 4, wherein each flip-flop includes at least one node connected to a high potential power supply via one of said at least two synchronizing control transistors, and wherein each flip-flop includes at least one other node connected to a low potential power supply via another of said at least two synchronizing control transistors.

13. An integrated circuit comprising:

a first flip-flop including a data input node and an output node and a plurality of high potential nodes coupled to a high potential power supply and a plurality of low potential nodes coupled to a low potential power supply;

a second flip-flop including a data input node and an output node and a plurality of high potential nodes coupled to the high potential power supply and a plurality of low potential nodes coupled to the low potential power supply;

a first synchronizing control transistor connected between the high potential power supply and one of the high potential nodes of the first flip-flop and a corresponding one of the high potential nodes of the second flip-flop;

a second synchronizing control transistor connected between the low potential power supply and one of the low potential nodes of the first flip-flop and a corresponding one of the low potential nodes of the second flip-flop;

wherein said first and second synchronizing control terminals have respective control terminals connected to a clock signal.

14. The integrated circuit as claimed in claim 13, wherein:

the first synchronizing control transistor is a P-channel transistor and the second synchronizing control transistor is an N-channel transistor.

15. The integrated circuit as claimed in claim 13, wherein:

each of said first and second flip-flops includes a plurality of stages, each stage connected between one of the high potential nodes and one of the low potential nodes.

* * * * *